(12) United States Patent
Yu et al.

(10) Patent No.: US 10,177,115 B2
(45) Date of Patent: Jan. 8, 2019

(54) PACKAGE STRUCTURES AND METHODS OF FORMING

(71) Applicant: Taiwan Semiconductor Manufacturing Company, Ltd., Hsin-Chu (TW)

(72) Inventors: Chen-Hua Yu, Hsin-Chu (TW); Der-Chyang Yeh, Hsin-Chu (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/478,471

(22) Filed: Sep. 5, 2014

(65) Prior Publication Data
US 2016/0071820 A1 Mar. 10, 2016

(51) Int. Cl.
*H01L 21/00* (2006.01)
*H01L 21/56* (2006.01)
(Continued)

(52) U.S. Cl.
CPC .......... *H01L 25/0655* (2013.01); *H01L 21/56* (2013.01); *H01L 21/6835* (2013.01); *H01L 21/6836* (2013.01); *H01L 21/76877* (2013.01); *H01L 23/3107* (2013.01); *H01L 24/17* (2013.01); *H01L 24/19* (2013.01); *H01L 24/81* (2013.01); *H01L 25/105* (2013.01); *H01L 25/50* (2013.01); *H01L 23/49816* (2013.01); *H01L 23/5389* (2013.01); *H01L 2221/68359* (2013.01); *H01L 2221/68372* (2013.01);
(Continued)

(58) Field of Classification Search
CPC . H01L 25/0655; H01L 21/56; H01L 21/6835; H01L 21/6836; H01L 21/768
See application file for complete search history.

(56) References Cited

U.S. PATENT DOCUMENTS 6,765,299 B2 * 7/2004 Takahashi ........... H01L 23/3107
257/688
7,084,513 B2 * 8/2006 Matsuki .............. H01L 23/3114
257/685
(Continued)

FOREIGN PATENT DOCUMENTS

CN 102214626 A 10/2011
CN 102569214 A 7/2012
(Continued)

*Primary Examiner* — David A Zarneke
(74) *Attorney, Agent, or Firm* — Slater Matsil, LLP

(57) ABSTRACT

Methods of forming and structures of packages are discussed herein. In an embodiment, a method includes forming a back side redistribution structure, and after forming the back side redistribution structure, adhering a first integrated circuit die to the back side redistribution structure. The method further includes encapsulating the first integrated circuit die on the back side redistribution structure with an encapsulant, forming a front side redistribution structure on the encapsulant, and electrically coupling a second integrated circuit die to the first integrated circuit die. The second integrated circuit die is electrically coupled to the first integrated circuit die through first external electrical connectors mechanically attached to the front side redistribution structure.

19 Claims, 17 Drawing Sheets

(51) Int. Cl.
- *H01L 21/683* (2006.01)
- *H01L 21/768* (2006.01)
- *H01L 25/065* (2006.01)
- *H01L 23/31* (2006.01)
- *H01L 23/00* (2006.01)
- *H01L 25/00* (2006.01)
- *H01L 25/10* (2006.01)
- *H01L 23/538* (2006.01)
- *H01L 23/498* (2006.01)

(52) U.S. Cl.
CPC .......... *H01L 2221/68381* (2013.01); *H01L 2224/0231* (2013.01); *H01L 2224/04105* (2013.01); *H01L 2224/12105* (2013.01); *H01L 2224/16227* (2013.01); *H01L 2224/24137* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2225/0651* (2013.01); *H01L 2225/06568* (2013.01); *H01L 2225/1035* (2013.01); *H01L 2225/1058* (2013.01); *H01L 2924/14* (2013.01); *H01L 2924/15311* (2013.01); *H01L 2924/181* (2013.01)

(56) References Cited

U.S. PATENT DOCUMENTS

| | | | |
|---|---|---|---|
| 7,319,049 B2* | 1/2008 | Oi | H01L 21/4857 257/686 |
| 7,989,270 B2* | 8/2011 | Huang et al. | H01L 21/00 438/127 |
| 8,093,711 B2* | 1/2012 | Zudock et al. | H01L 23/04 257/698 |
| 8,183,696 B2* | 5/2012 | Meyer et al. | H01L 23/48 257/774 |
| 8,293,574 B2* | 10/2012 | Mihara | H01L 23/5389 438/107 |
| 8,619,431 B2* | 12/2013 | Lin et al. | H05K 1/18 361/762 |
| 8,633,551 B1* | 1/2014 | Teh | H01L 24/19 257/414 |
| 8,754,514 B2* | 6/2014 | Yu et al. | H01L 23/481 257/686 |
| 8,883,561 B2* | 11/2014 | Park et al. | H01L 23/49827 438/126 |
| 8,895,440 B2* | 11/2014 | Choi et al. | H01L 21/78 438/675 |
| 8,957,530 B2* | 2/2015 | Shim | H01L 21/6835 257/686 |
| 8,975,111 B2* | 3/2015 | Lin | H01L 21/6835 438/55 |
| 9,040,361 B2* | 5/2015 | Chang et al. | H01L 23/31 257/774 |
| 9,406,658 B2* | 8/2016 | Lee | H01L 25/16 |
| 2005/0161833 A1 | 7/2005 | Takeuchi et al. | |
| 2006/0001179 A1* | 1/2006 | Fukase | H01L 23/147 257/778 |
| 2007/0096292 A1* | 5/2007 | Machida | H01L 21/4857 257/700 |
| 2008/0116564 A1* | 5/2008 | Yang | H01L 23/5389 257/698 |
| 2009/0146301 A1* | 6/2009 | Shimizu | B29C 43/18 257/738 |
| 2010/0019368 A1* | 1/2010 | Shin | H01L 23/24 257/686 |
| 2010/0230806 A1* | 9/2010 | Huang et al. | H01L 25/16 257/723 |
| 2011/0068427 A1* | 3/2011 | Paek | H01L 24/19 257/433 |
| 2011/0156231 A1* | 6/2011 | Guzek | H01L 25/16 257/686 |
| 2011/0259630 A1* | 10/2011 | Park | H01L 23/13 174/260 |
| 2011/0285005 A1 | 11/2011 | Lin et al. | |
| 2012/0104623 A1* | 5/2012 | Pagaila | H01L 23/13 257/774 |
| 2012/0161315 A1* | 6/2012 | Lin et al. | H01L 23/498 257/738 |
| 2012/0208319 A1* | 8/2012 | Meyer et al. | H01L 21/00 438/107 |
| 2012/0211885 A1* | 8/2012 | Choi et al. | H01L 23/498 257/737 |
| 2012/0273960 A1* | 11/2012 | Park et al. | H01L 23/48 257/774 |
| 2013/0009308 A1 | 1/2013 | Kwon | |
| 2013/0075902 A1 | 3/2013 | Chow et al. | |

FOREIGN PATENT DOCUMENTS

| KR | 20070051165 A | 5/2007 |
|---|---|---|
| KR | 20130005465 A | 1/2013 |

* cited by examiner

PACKAGE STRUCTURES AND METHODS OF FORMING

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components such as integrated circuit dies may also require smaller packages that utilize less area than packages of the past, in some applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
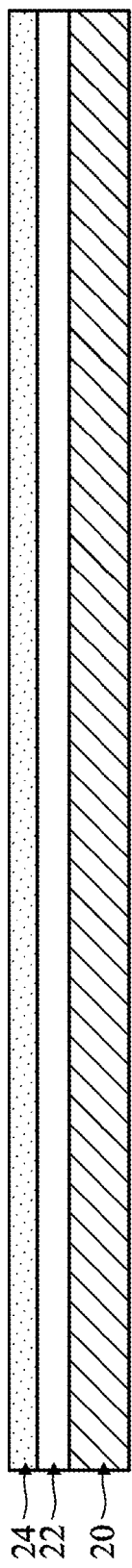
FIGS. 1 through 13 are sectional views of intermediate steps during a process for forming a package-on-package structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "topmost," and the like, may be used herein for ease of description to describe one element or feature's relationship to another element(s) or feature(s) as illustrated in the figures. Similarly, terms such as "front side" and "back side" may be used herein to more easily identify various components, and may identify that those components are, for example, on opposing sides of another component. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely package-on-package or die-on-package configurations with a fan-out or fan-in wafer-level package. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 13 illustrate cross sectional views of intermediate steps during a process for forming a package-on-package structure in accordance with some embodiments. FIG. 1 illustrates a carrier substrate 20, a release layer 22 formed on the carrier substrate 20, and a dielectric layer 24 formed on the release layer 22. The carrier substrate 20 may be a glass carrier substrate, a ceramic carrier substrate, or the like. The carrier substrate 20 may be a wafer. The release layer 22 may be formed of a polymer-based material, which may be removed along with the carrier substrate 20 from the overlying structures that will be formed in subsequent steps. In some embodiments, the release layer 22 is an epoxy-based thermal-release material, which loses its adhesive property when heated, such as a Light-to-Heat-Conversion (LTHC) release coating. In other embodiments, the release layer 22 may be an ultra-violet (UV) glue, which loses its adhesive property when exposed to UV lights. The release layer 22 may be dispensed as a liquid and cured, may be a laminate film laminated onto the carrier substrate 20, or may be the like. The top surface of the release layer 22 may be leveled and may have a high degree of co-planarity.

A dielectric layer 24 is formed on the release layer 22. The bottom surface of the dielectric layer 24 may be in contact with the top surface of the release layer 22. In some embodiments, the dielectric layer 24 is formed of a polymer, such as polybenzoxazole (PBO), polyimide, benzocyclobutene (BCB), or the like. In other embodiments, the dielectric layer 24 is formed of a nitride such as silicon nitride; an oxide such as silicon oxide, PhosphoSilicate Glass (PSG), BoroSilicate Glass (BSG), Boron-doped PhosphoSilicate Glass (BPSG), or the like; or the like. The dielectric layer 24 may be formed by any acceptable deposition process, such as spin coating, chemical vapor deposition (CVD), laminating, the like, or a combination thereof.

Figure 2:
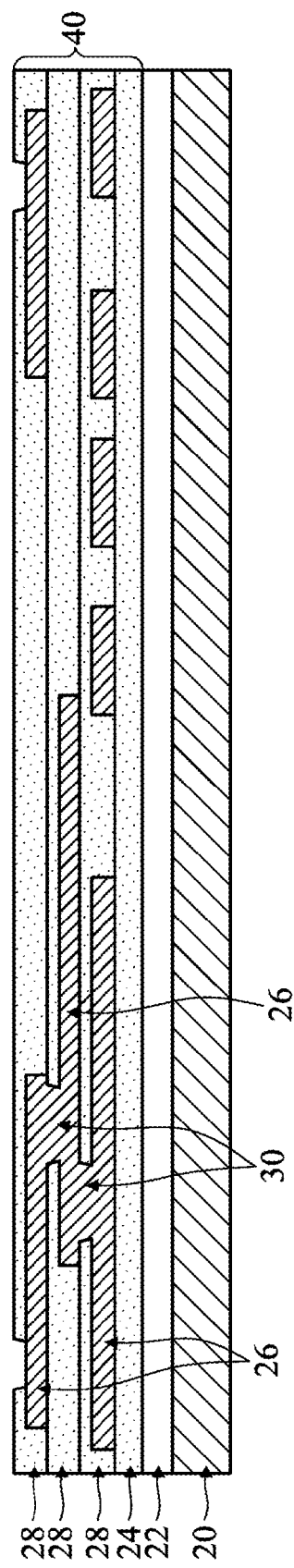

Referring to FIG. 2, a back side redistribution structure 40 is formed. The back side redistribution structure 40 can comprise any number of dielectric layers 28, metallization patterns 26, and vias 30. As illustrated, the back side redistribution structure 40 includes three dielectric layers 28 each having a respective metallization pattern 26.

Metallization pattern 26 is formed first on the dielectric layer 24. As an example to form metallization pattern 26, a seed layer (not shown) is formed over the dielectric layer 24. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, Physical Vapor Deposition (PVD) or the like. A photo resist is then formed and patterned on the seed layer. The photo resist may be formed by spin coating or the like and may be exposed to light for patterning. The pattern of the photo resist corresponds to the metallization pattern 26. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 26.

The dielectric layer 28 is formed on the metallization pattern 26 and the dielectric layer 24. In some embodiments, the dielectric layer 28 is formed of a polymer, which may be a photo-sensitive material such as PBO, polyimide, BCB, or the like, that may be patterned using a lithography mask. In other embodiments, the dielectric layer 28 is formed of a nitride such as silicon nitride; an oxide such as silicon oxide, PSG, BSG, BPSG; or the like. The dielectric layer 28 may be formed by spin coating, lamination, CVD, the like, or a combination thereof. The dielectric layer 28 is then patterned to form openings to expose portions of the metallization pattern 26. The patterning may be by an acceptable process, such as by exposing the dielectric layer 28 to light when the dielectric layer is a photo-sensitive material or by etching using, for example, an anisotropic etch.

One or more additional metallization pattern 26 and dielectric layer 28 may be formed in the back side redistribution structure 40 by repeating the processes for forming a metallization patterns 26 and dielectric layer 28. The vias 30 may be formed during the formation of a metallization pattern 26 by forming the seed layer and conductive material of the metallization pattern 26 in the opening of the underlying dielectric layer 28. The vias 30 may therefore interconnect and electrically couple the various metallization patterns.

Figure 3:
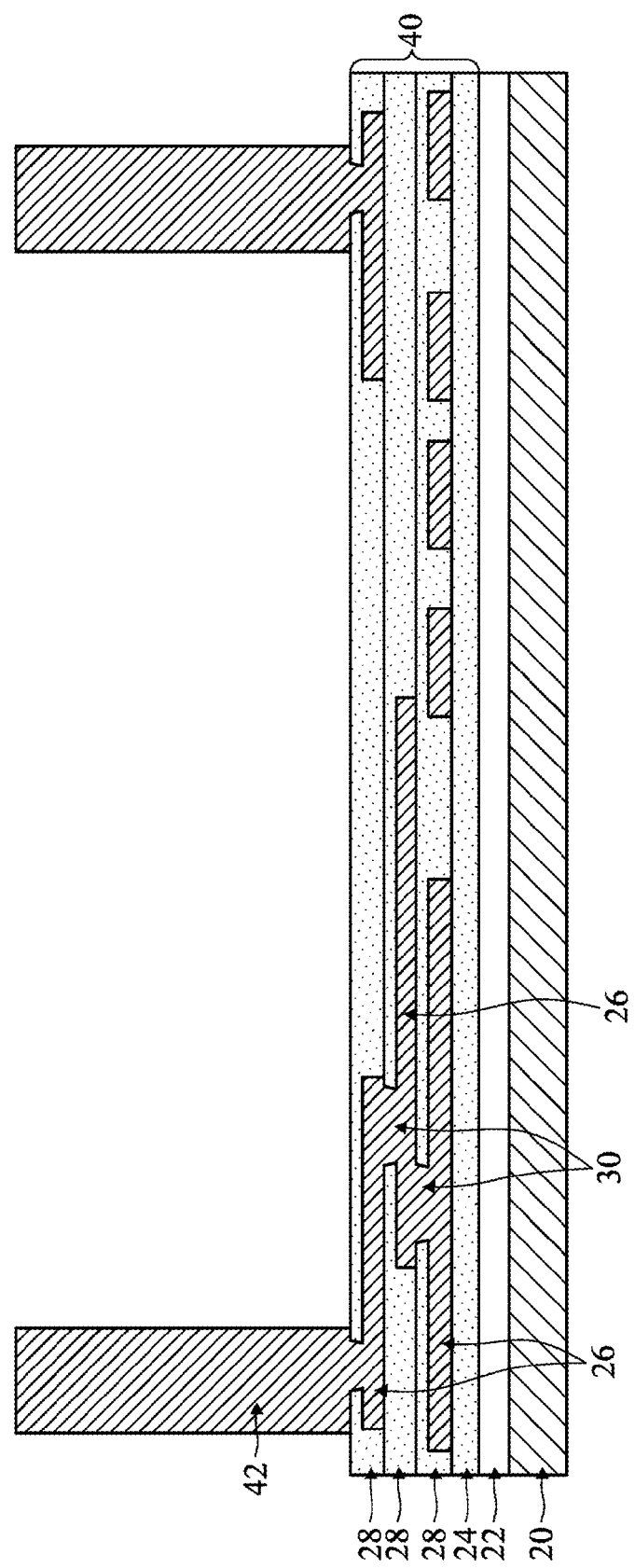

Referring to FIG. 3, through vias 42 are formed. As an example to form the through vias 42, a seed layer is formed over the back side redistribution structure 40, e.g., the uppermost dielectric layer 28 and the exposed portions of the uppermost metallization pattern 26 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 42.

Figure 4:
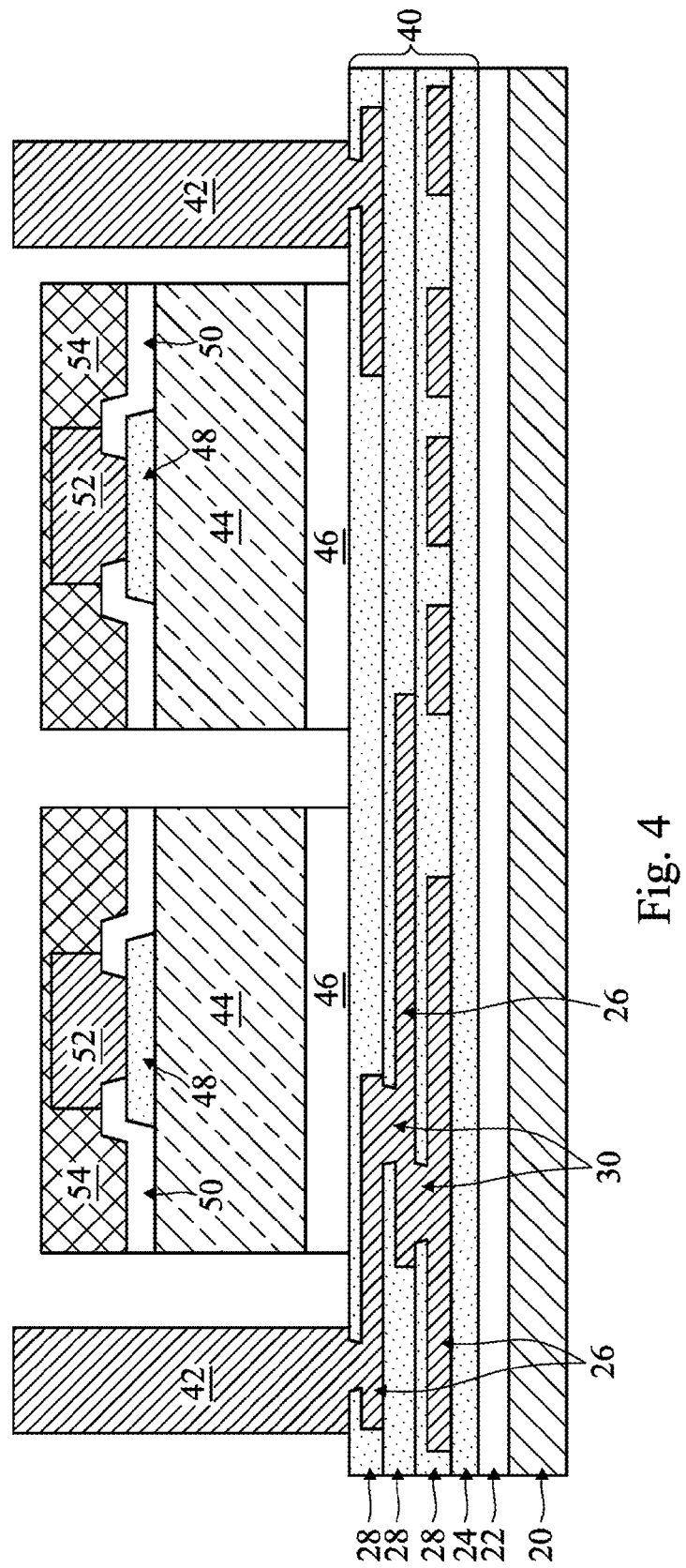

In FIG. 4, integrated circuit dies 44 are adhered to the dielectric layer 28 by an adhesive 46. As illustrated, two integrated circuit dies 44 are adhered, and in other embodiments, one integrated circuit die or more integrated circuit dies may be adhered. Before being adhered to the dielectric layer 28, the integrated circuit dies 44 may be processed according to applicable manufacturing processes to form integrated circuits in the integrated circuit dies 44. For example, the integrated circuit dies 44 each comprise a semiconductor substrate, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate and may be interconnected by interconnect structures formed by, for example, metallization patterns in one or more dielectric layers on the semiconductor substrate to form an integrated circuit.

The integrated circuit dies 44 further comprise pads 48, such as aluminum pads, to which external connections are made. The pads 48 are on what may be referred to as respective active sides of the integrated circuit dies 44. Passivation films 50 are on the integrated circuit dies 44 and on portions of the pads 48. Openings are through the passivation films 50 to the pads 48. Die connectors 52, such as conductive pillars (for example, comprising a metal such as copper), are in the openings through passivation films 50 and are mechanically and electrically coupled to the respective pads 48. The die connectors 52 may be formed by, for example, plating or the like. The die connectors 52 electrically couple the respective integrated circuits of the integrate circuit dies 44. One die connector 52 is shown on each integrated circuit die 44 for clarity and simplicity, and one of ordinary skill in the art will readily understand that more than one die connector 52 may be present.

A dielectric material 54 is on the active sides of the integrated circuit dies 44, such as on the passivation films 50 and the die connectors 52. The dielectric material 54 laterally encapsulates the die connectors 52, and the dielectric material 54 is laterally co-terminus with the respective integrated circuit dies 44. The dielectric material 54 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 46 is on back sides of the integrated circuit dies 44 and adheres the integrated circuit dies 44 to the back side redistribution structure 40, such as the uppermost dielectric layer 28 in the illustration. The adhesive 46 may be any suitable adhesive, epoxy, or the like. The adhesive 46 may be applied to a back side of the integrated circuit dies 44, such as to a back side of the respective semiconductor wafer. The integrated circuit dies 44 may be singulated, such as by sawing or dicing, and adhered to the dielectric layer 28 by the adhesive 46 using, for example, a pick-and-place tool.

Figure 5:
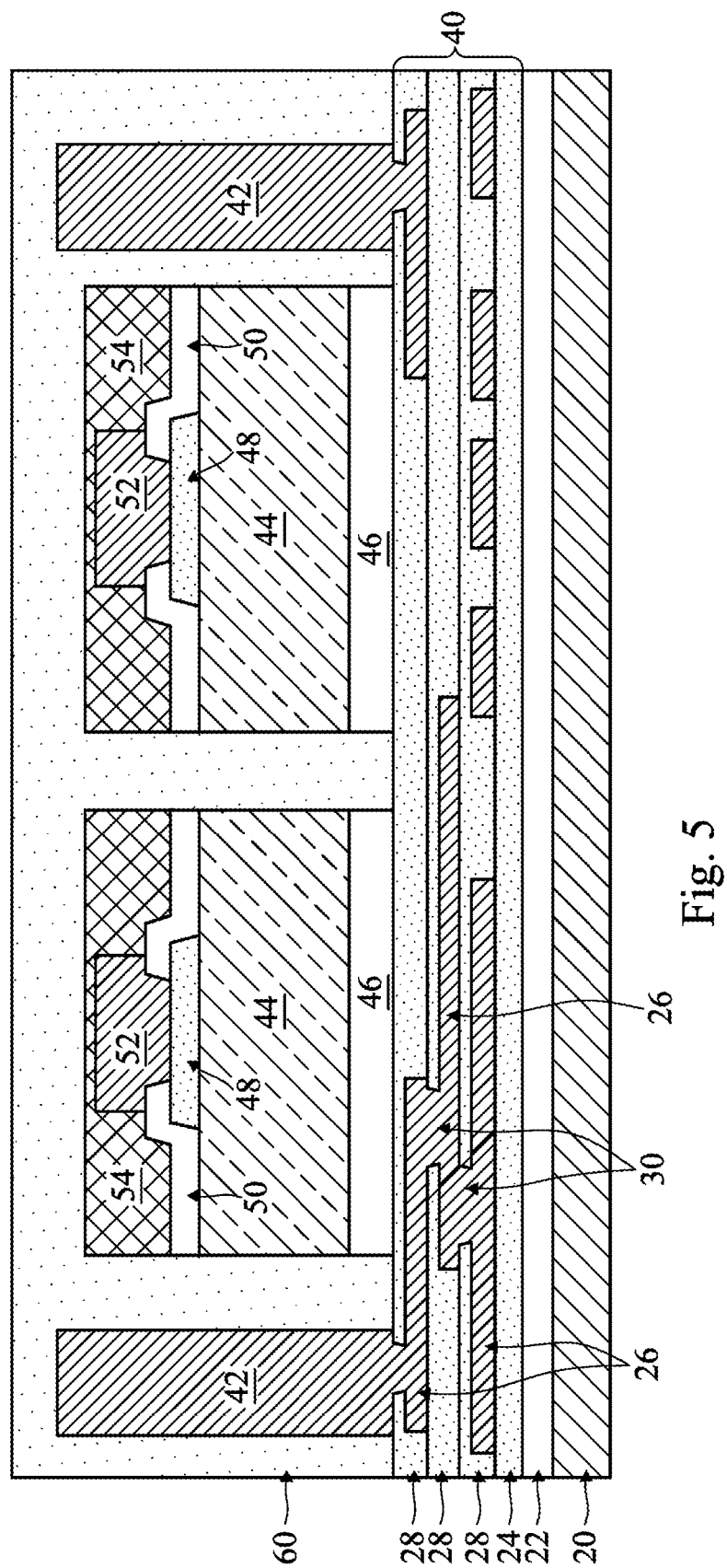
Figure 6:
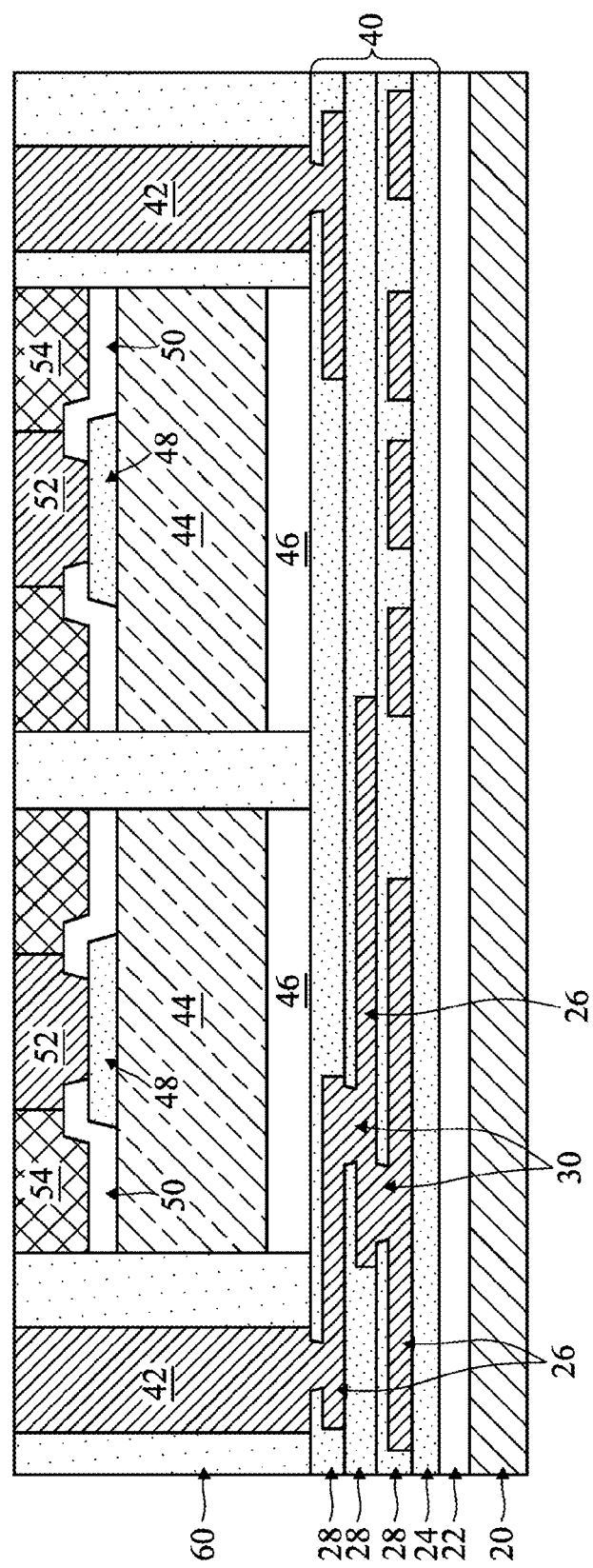

In FIG. 5, an encapsulant 60 is formed on the various components. The encapsulant 60 may be a molding compound, epoxy, or the like, and may be applied by compression molding, transfer molding, or the like. In FIG. 6, after curing, the encapsulant 60 undergoes a grinding process to expose the through vias 42 and die connectors 52. Top surfaces of the through vias 42, die connectors 52, and encapsulant 60 are co-planar after the grinding process. In some embodiments, the grinding may be omitted, for example, if through vias 42 and die connectors 52 are already exposed.

Figure 7:
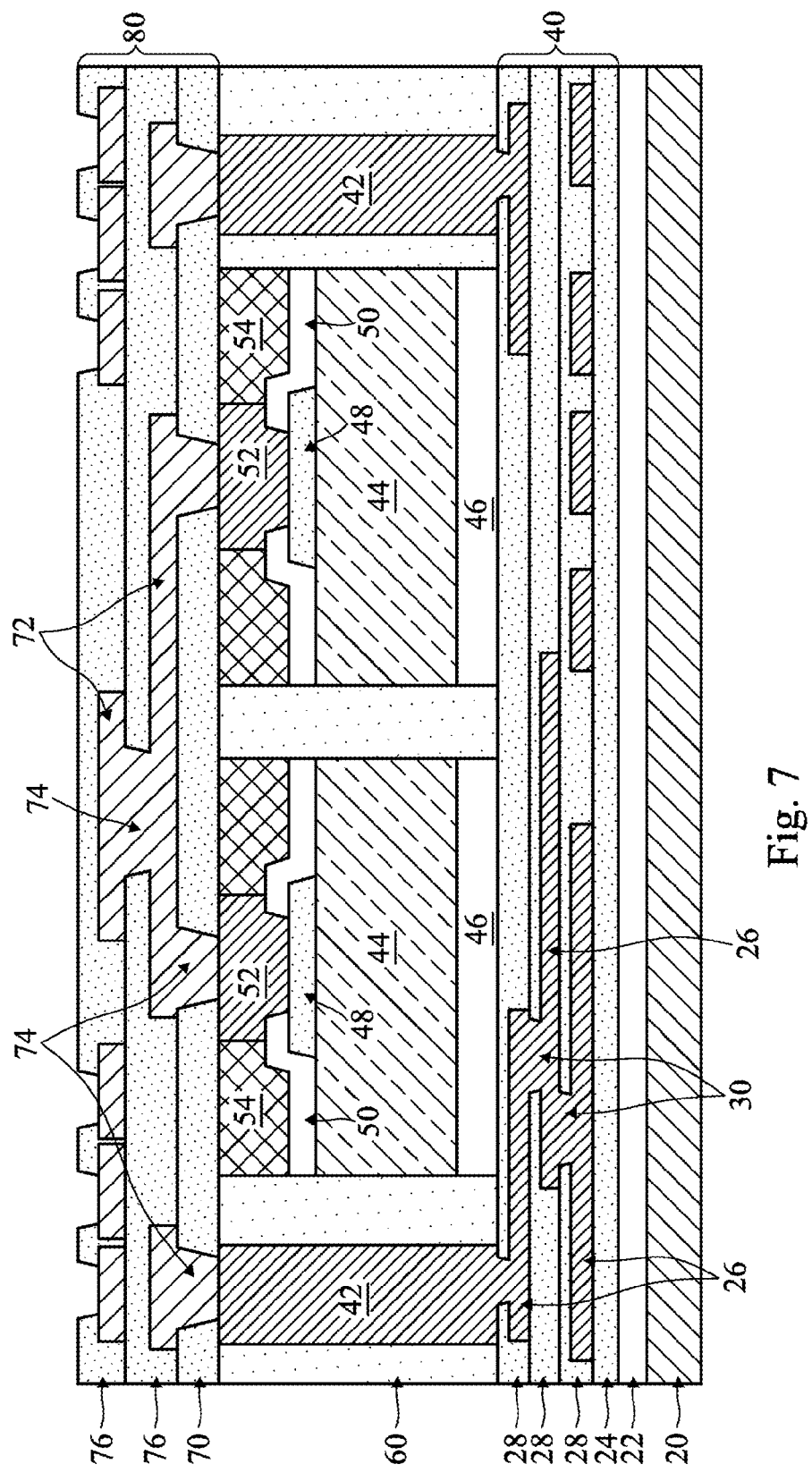

In FIG. 7, a front side redistribution structure 80 is formed. The front side redistribution structure 80 can comprise any number of dielectric layers 70 and 76, metallization patterns 72, and vias 74. As illustrated, the front side redistribution structure 80 includes a dielectric layer 70 and two dielectric layers 76 each having a respective metallization pattern 72.

The dielectric layer 70 is formed on the encapsulant 60, through vias 42, and die connectors 52. In some embodiments, the dielectric layer 70 is formed of a polymer, which may be a photo-sensitive material such as PBO, polyimide, BCB, or the like, that may be easily patterned using a lithography mask. In other embodiments, the dielectric layer 70 is formed of a nitride such as silicon nitride; an oxide such as silicon oxide, PSG, BSG, BPSG; or the like. The dielectric layer 70 may be formed by spin coating, lamination, CVD, the like, or a combination thereof. The dielectric layer 70 is then patterned to form openings to expose portions of the through vias 42. The patterning may be by an acceptable process, such as by exposing the dielectric layer 70 to light when the dielectric layer is a photo-sensitive material or by etching using, for example, an anisotropic etch.

Metallization pattern 72 with vias 74 is formed first on the dielectric layer 70. As an example to form metallization pattern 72, a seed layer (not shown) is formed over the dielectric layer 70. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 72. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 72 and vias 74. The vias 74 are formed in openings in the underlying layer, e.g., the dielectric layer 70.

The dielectric layer 76 is formed on the metallization pattern 72 and the dielectric layer 70. In some embodiments, the dielectric layer 76 is formed of a polymer, which may be a photo-sensitive material such as PBO, polyimide, BCB, or the like, that may be easily patterned using a lithography mask. In other embodiments, the dielectric layer 76 is formed of a nitride such as silicon nitride; an oxide such as silicon oxide, PSG, BSG, BPSG; or the like. The dielectric layer 76 may be formed by spin coating, lamination, CVD, the like, or a combination thereof. The dielectric layer 76 is then patterned to form openings to expose portions of the metallization pattern 72. The patterning may be by an acceptable process, such as by exposing the dielectric layer 76 to light when the dielectric layer is a photo-sensitive material or by etching using, for example, an anisotropic etch.

One or more additional metallization pattern 72 and dielectric layer 76 may be formed in the front side redistribution structure 80 by repeating the processes for forming a metallization patterns 72 and dielectric layer 76. The vias 74 may be formed during the formation of a metallization pattern 72 by forming the seed layer and conductive material of the metallization pattern 72 in the opening of the underlying dielectric layer 76. The vias 74 may therefore interconnect and electrically couple the various metallization patterns.

Figure 8:
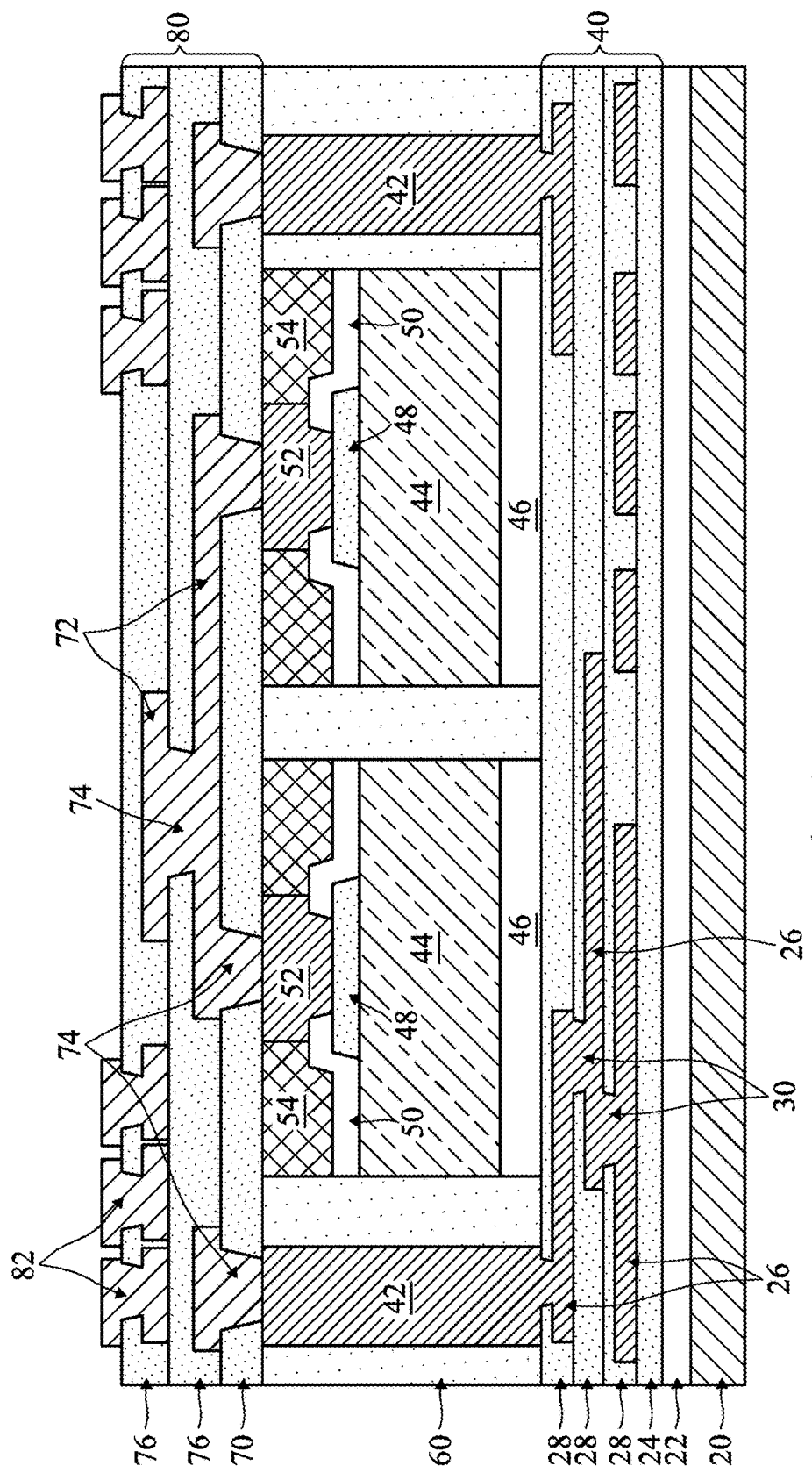

In FIG. 8, pads 82, which may be referred to as Under Bump Metallurgies (UBMs), are formed on an exterior surface of the front side redistribution structure 80. In the illustrated embodiment, pads 82 include vias through openings on the topmost dielectric layer 76. As an example to form the pads 82, a seed layer (not shown) is formed over the topmost dielectric layer 76. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 82. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 82, which can include the vias. The vias are formed in openings in the underlying layer, e.g., the topmost dielectric layer 76.

For convenience, the structure illustrated in FIG. 8 will be referred to as a first package 100. In the illustrated embodiment, the first package comprises the back side redistribution structure 40, the integrated circuit dies 44, the encapsulant 60, the front side redistribution structure 80, and the various electrical interconnects and couplings therein. The front side of the first package, e.g., the side on which is the front side redistribution structure 80, may also be referred to as a "face" or "face side" of the first package because the front side is the side of the package that the active sides of the integrated circuit dies 44 face. As illustrated, processing may continue and may be performed on the first package 100.

Figure 9:
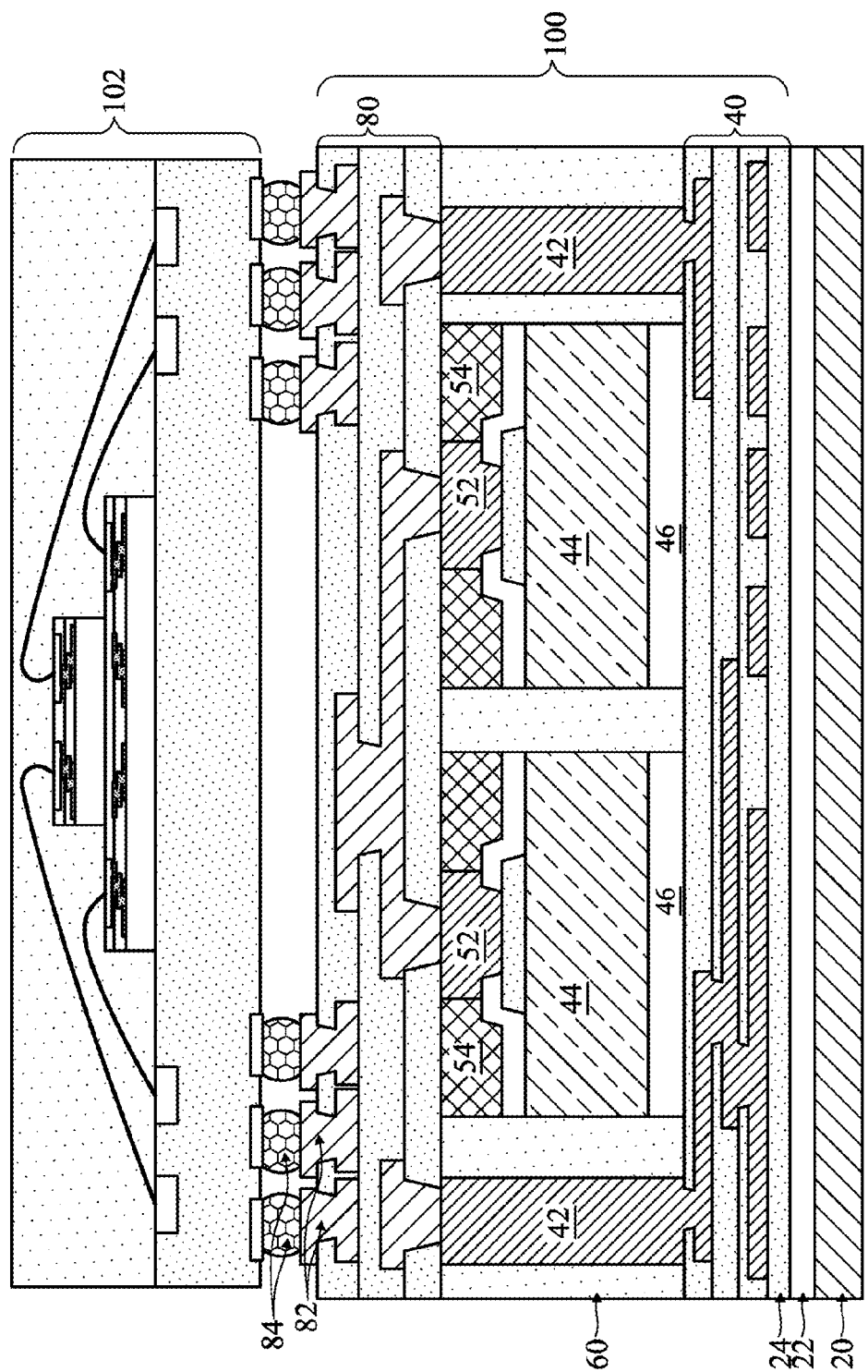

In FIG. 9, a second package 102 is attached to the first package 100. The second package 102 can be and/or comprise any package component. For example, as illustrated, the second package 102 comprises a substrate, two stacked integrated circuit dies on the substrate, wire bonds electrically coupling the integrated circuit dies to the substrate, and an encapsulant encapsulating the stacked integrated circuit dies and the wire bonds. In an example, the integrated circuit dies of the second package 102 are memory dies, such as dynamic random access memory (DRAM) dies. The second package 102 is electrically and mechanically coupled to the first package by external electrical connectors 84 attached to the pads 82. In some embodiments, the external electrical connectors 84 can include low-temperature reflowable material, such as solder, such as a lead-free solder, and in additional embodiments, the external electrical connectors 84 can include metal pillars. In some embodiments, the external electrical connectors 84 are controlled collapse chip connection (C4) bumps, microbumps, or the like. In some embodiments, the external electrical connectors 84 can be reflowed to attach the second package 102 to the pads 82 of the first package. The integrated circuit dies of the second package 102 are electrically and communicatively coupled to the integrated circuit dies 44 of the first package 100 through, for example, the wire bonds and substrate in the second package 102, the external electrical connectors 84, and the front side redistribution structure 80.

Figure 10:
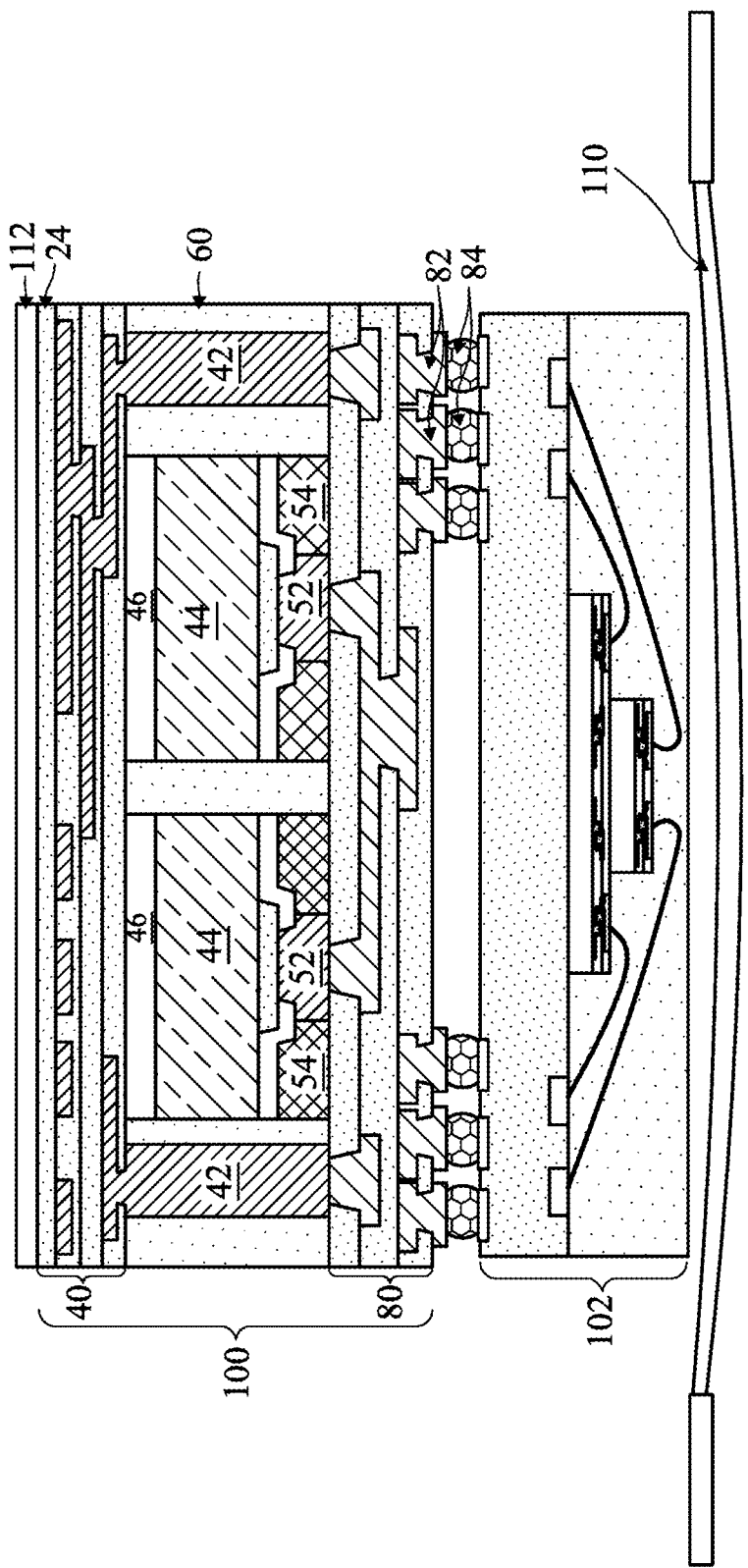

In FIG. 10, a carrier substrate de-bonding is performed to detach (de-bond) carrier substrate 20 from the first package. In accordance with some embodiments, the de-bonding includes projecting a light such as a laser light or an UV light on release layer 22 so that release layer 22 decomposes under the heat of the light and carrier substrate 20 can be removed. The structure is then flipped over and placed on a tape 110. A back side film 112 can optionally then be formed on the back side redistribution structure 40, such as the dielectric layer 24. The back side film 112 can be a polymer-like film, resin, epoxy, or the like. The back side film 112 can compensate for warpage during subsequent processing, such as thermal cycling during a reflow process.

Figure 11:
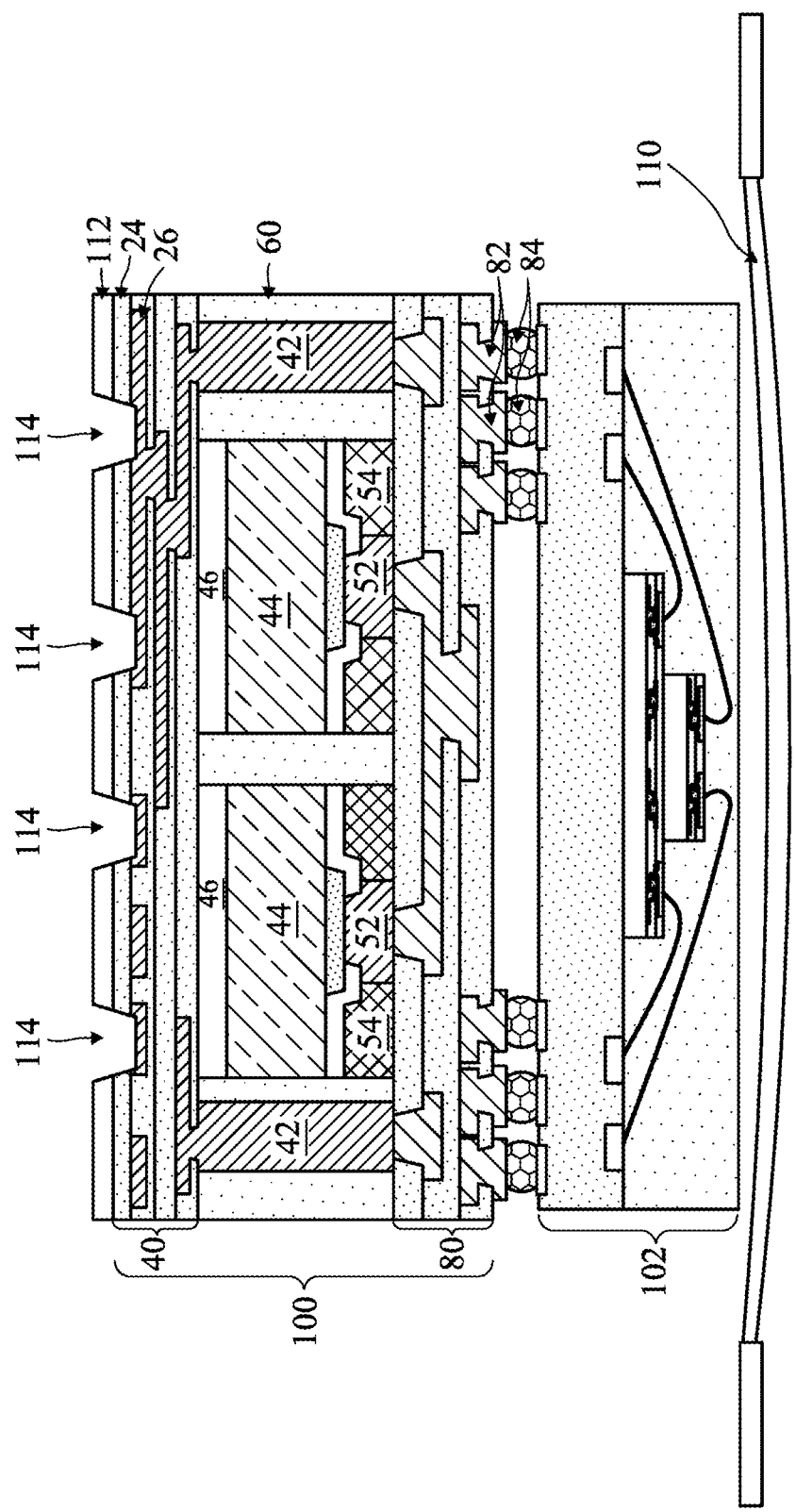

In FIG. 11, openings 114 are formed through the dielectric layer 24 to expose portions of the topmost metallization pattern 26. The openings 114 may be formed, for example, using laser drilling, etching, or the like.

Figure 12:
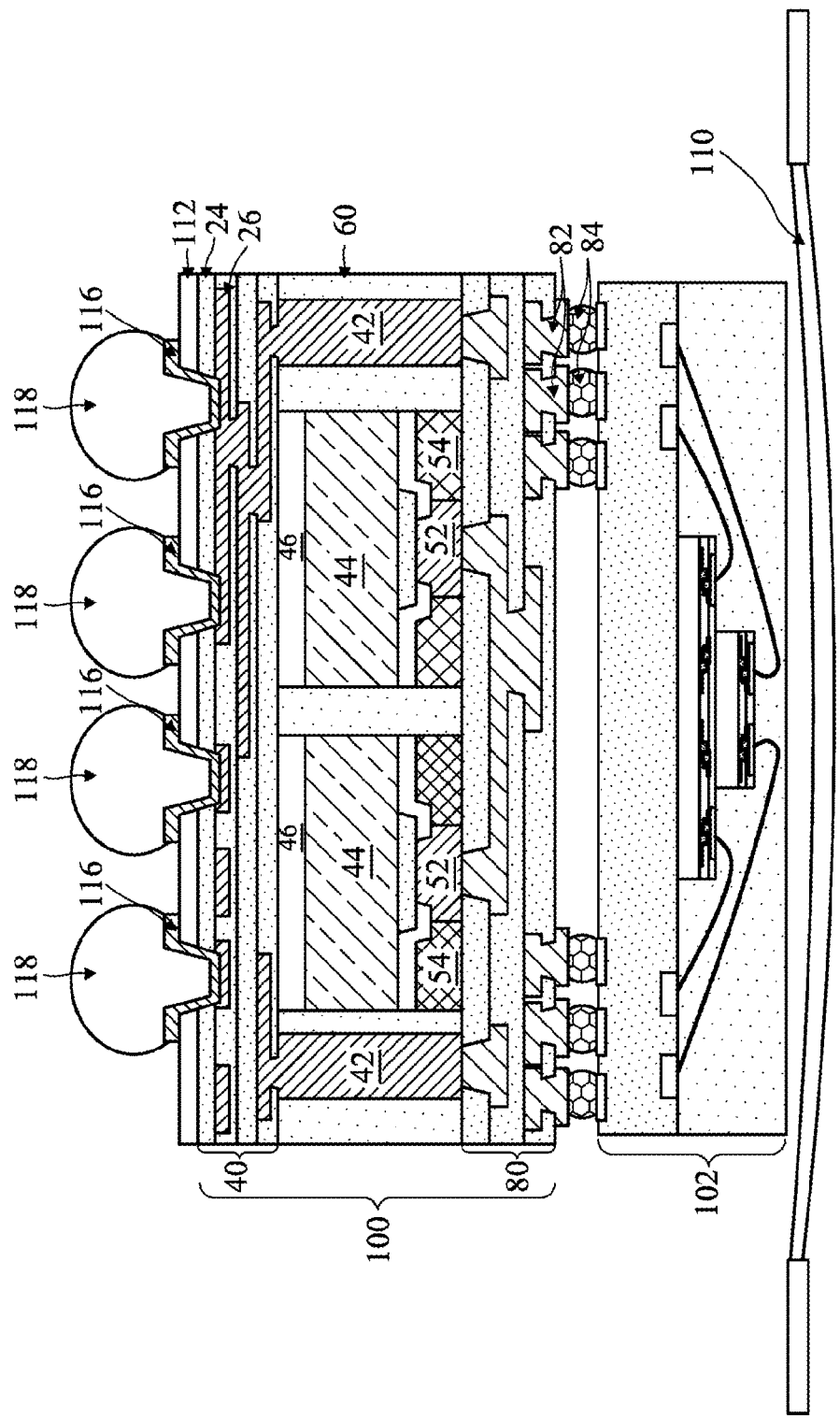

In FIG. 12, pads 116, such as UBMs, and external electrical connectors 118, such as solder balls like ball grid array (BGA) balls, are formed on the topmost metallization pattern 26 through the openings 114. The pads 116 may be formed in the openings 114 and in electrical contact with the topmost metallization pattern 26. The pads 116 may comprise three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be used for the formation of the pads 116. The pads 116 may be formed by forming each layer over the dielectric layer 24 and/or back side film 112 and along the interior of the openings 114 to the topmost metallization pattern 26. Each layer may be formed using a plating process, such as electroplating or electroless plating, although other processes of formation, such as sputtering, evaporation, or PECVD process, may be used. Once the desired layers have been formed, portions of the layers may then be removed through a suitable photolithographic masking and etching process to remove the undesired material and to leave the pads 116 in a desired shape. In other embodiments, the pads 116 may be omitted.

The external electrical connectors 118 are formed on the pads 116. The external electrical connectors 118 may include a low-temperature reflowable material such as solder, which may be lead-free or lead-containing. The external electrical connectors 118 may be formed by using an appropriate ball drop process. In other embodiments where the pads 116 are omitted, the external electrical connectors are formed directly on the metallization pattern 26 through the openings 114.

Figure 13:
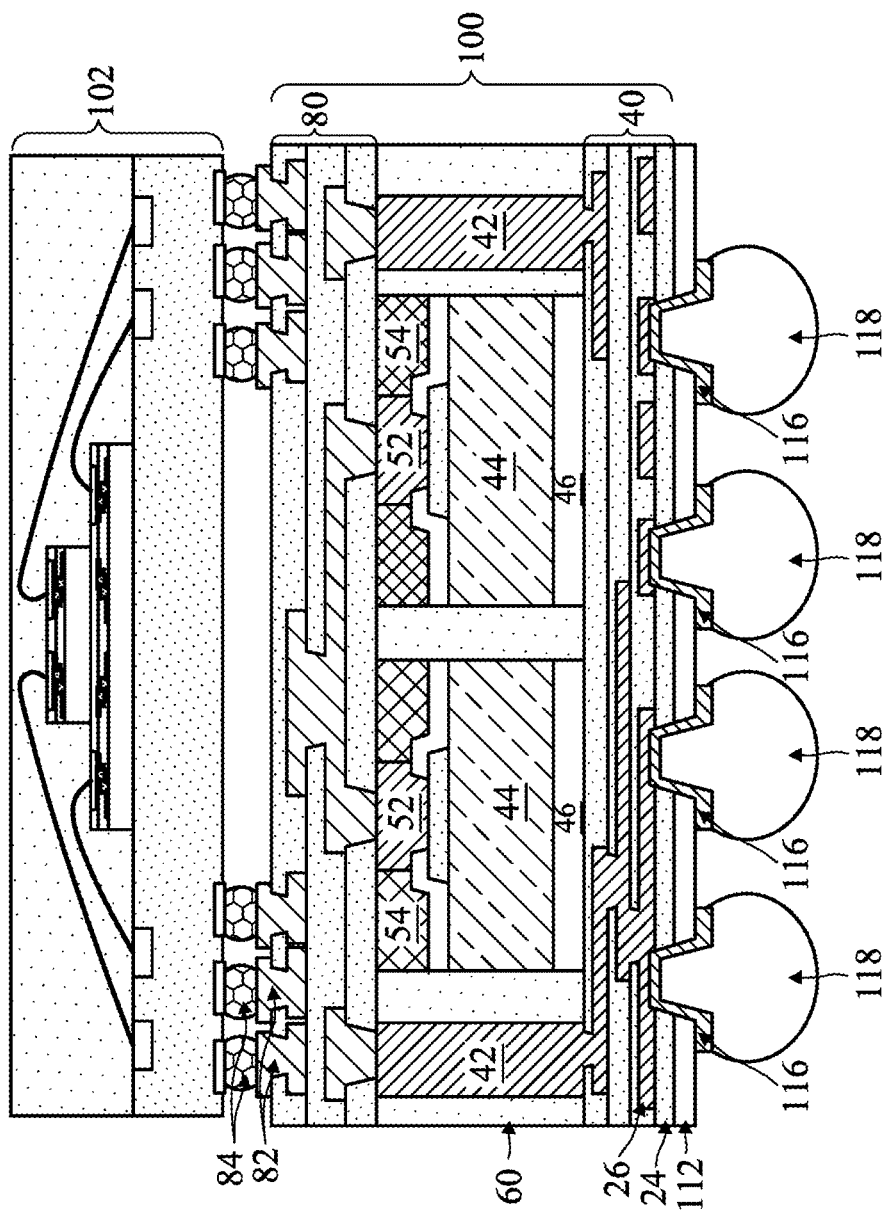
Figure 14:
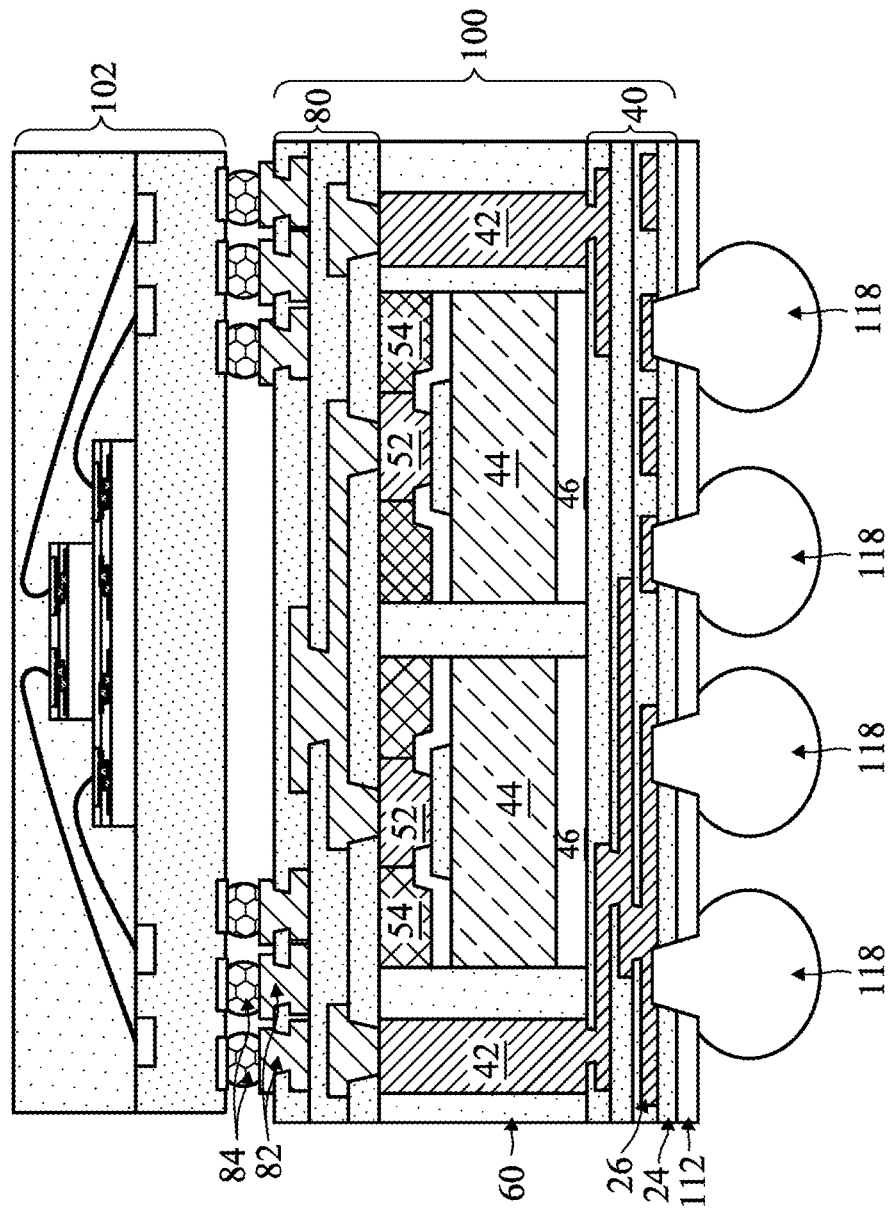
FIG. 14 is a package-on-package structure in accordance with some embodiments.

In FIGS. 13 and 14, the first package 100 and the second package 102 are removed from the tape 110. Hence, a package-on-package structure is formed. FIG. 13 illustrates an embodiment with the pads 116, and FIG. 14 illustrates an embodiment where the pads 116 are omitted.

Figure 15:
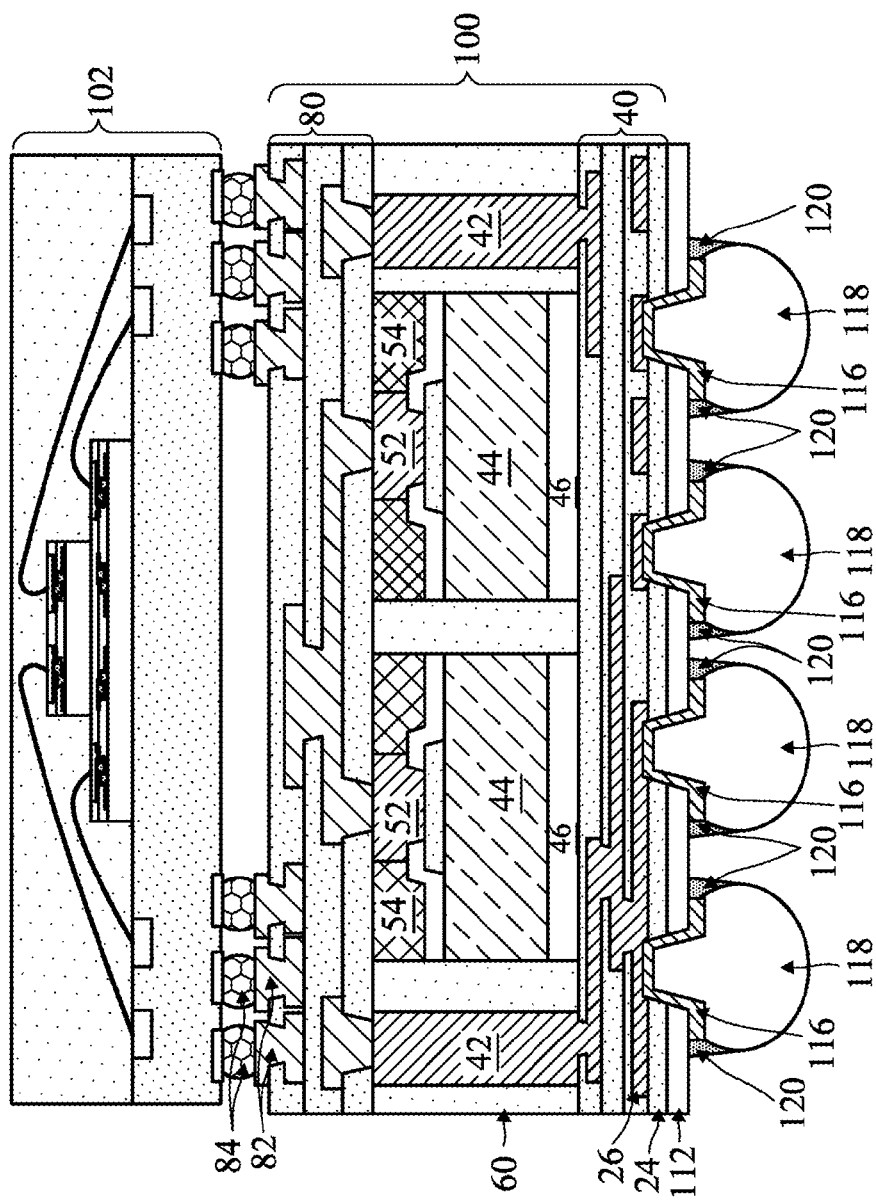
FIG. 15 is a package-on-package structure in accordance with some embodiments.
Figure 16:
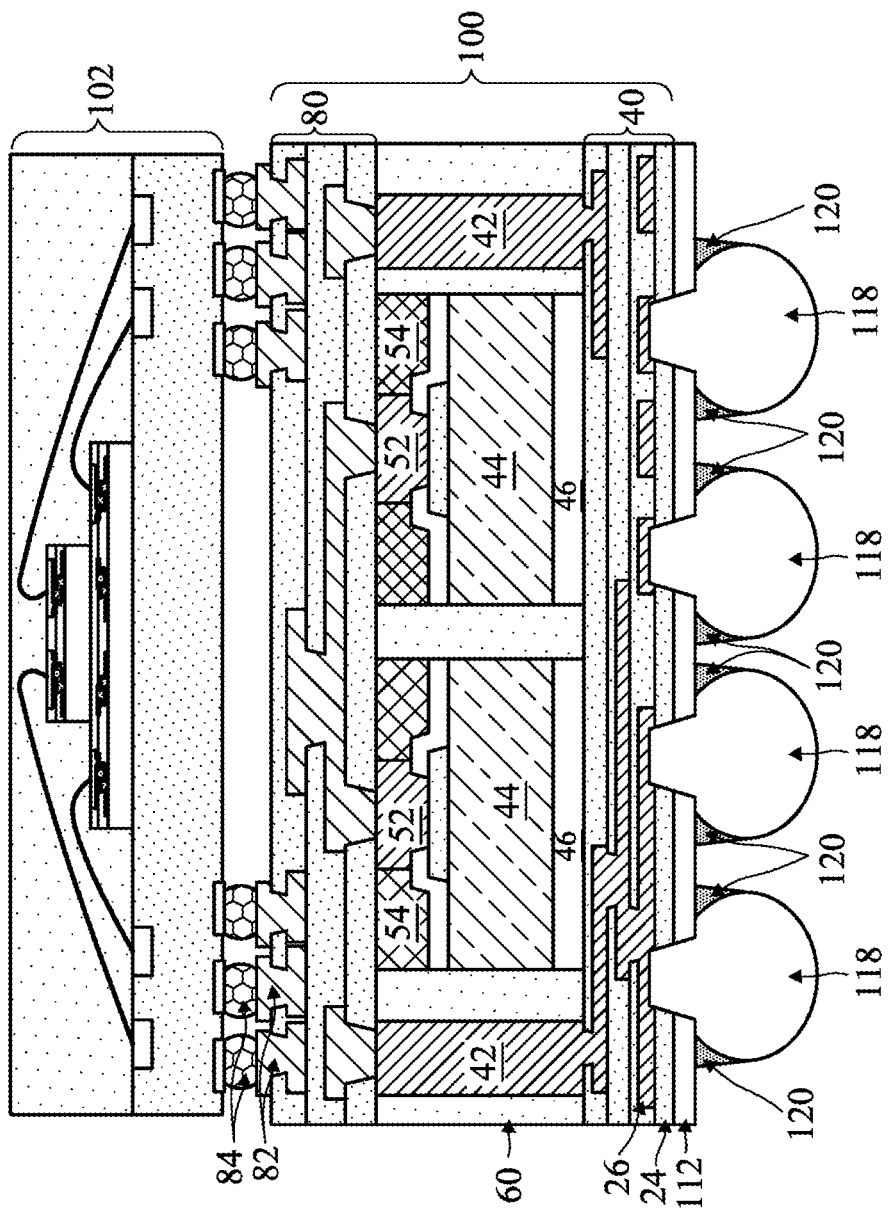
FIG. 16 is a package-on-package structure in accordance with some embodiments.

FIGS. 15 and 16 illustrate the package-on-package structures of FIGS. 13 and 14, respectively, with a modification to include an epoxy flux 120 in regions surrounding the external electrical connectors 118 and between the external electrical connectors 118 and the back side film 112 (e.g., if present) and/or the dielectric layer 24 of the back side redistribution structure 40. The epoxy flux 120 can form a seal around the external electrical connectors 118 to aid in preventing moisture or other contaminants from penetrating a joint between the external electrical connectors 118, pads 116, back side film 112, and/or dielectric layer 24. The epoxy flux 120 can be applied after the external electrical connectors 118 are formed and before the packages are removed from the tape 110 in FIGS. 12 and 13.

Figure 17:
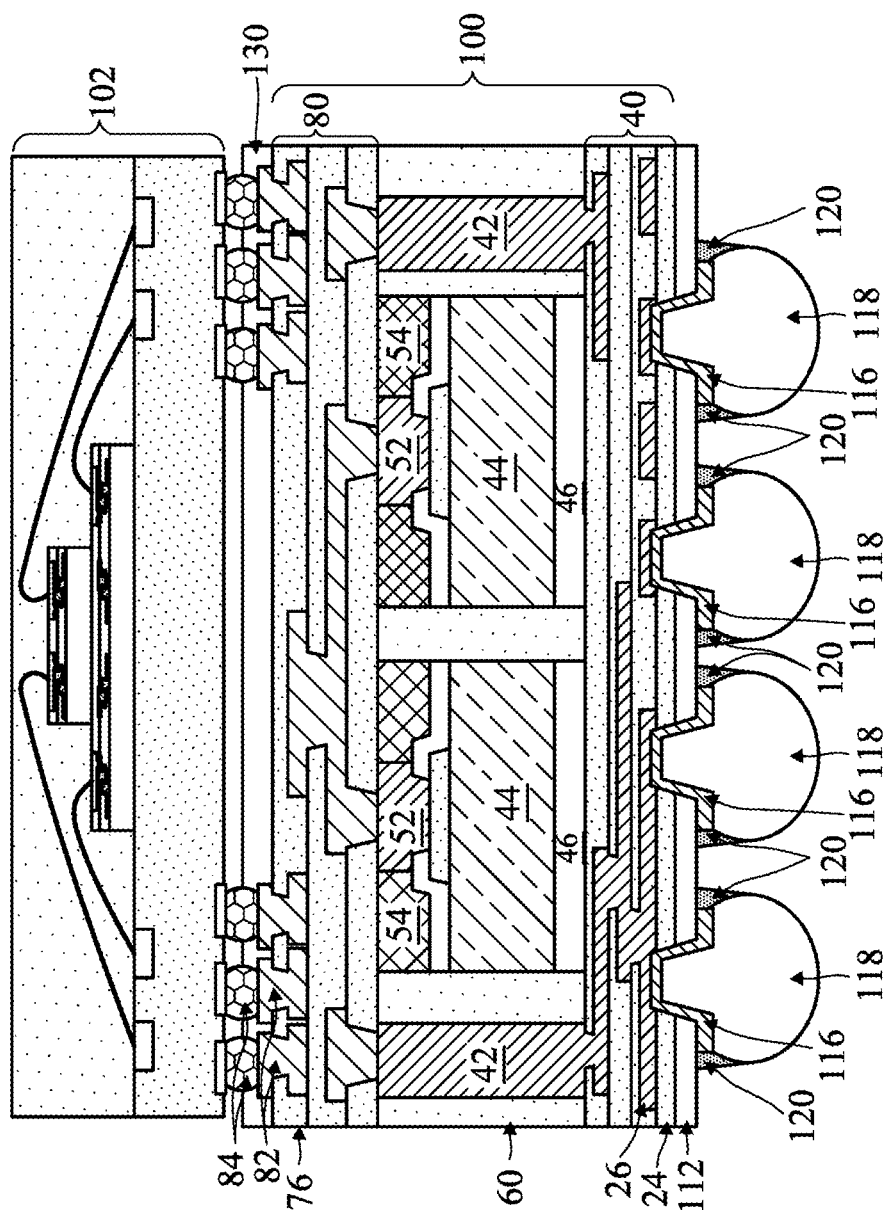
FIG. 17 is a package-on-package structure in accordance with some embodiments.

FIG. 17 illustrates the package-on-package structure of FIG. 15 with a modification to include a front side film 130. The front side film 130 may be similar to the back side film 112 and can be formed on the front side redistribution structure 80, such as the dielectric layer 76. The front side film 130 can be a polymer-like film, resin, epoxy, or the like, and can be formed by a spin-on or lamination technique before attaching the second package in FIG. 9. Although not illustrated, the front side film 130 can be formed in the package-on-package structure of FIG. 16.

Figure 18:
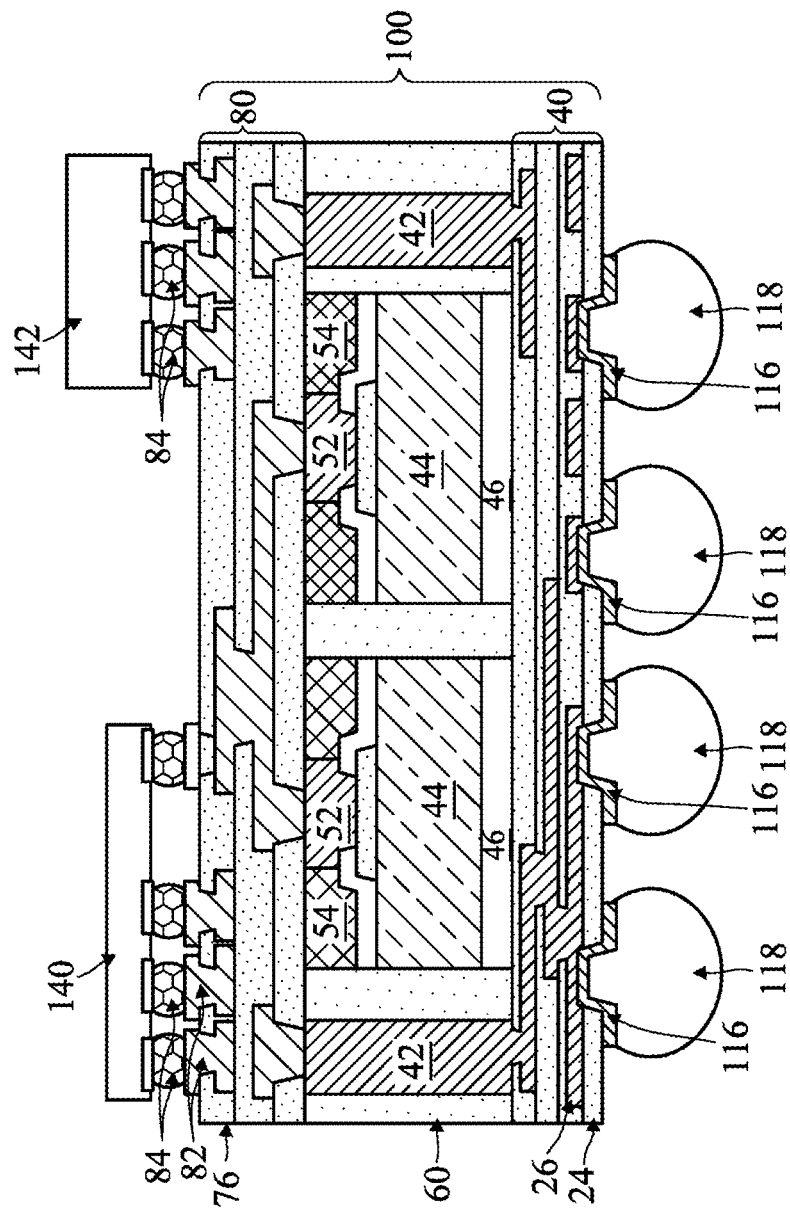
FIG. 18 is a die-on-package structure in accordance with some embodiments.

FIG. 18 illustrates another embodiment. In this embodiment, integrated circuit dies 140 and 142 are directly attached to the front side redistribution structure 80 of the first package 100 by external electrical connectors 84. Accordingly, a die-on-package structure can be formed. Various modifications of the package discussed in FIGS. 13 through 17 may be incorporated.

Various modifications to a package-on-package structure or a die-on-package structure have been discussed herein. However, one of ordinary skill in the art will readily understand that other modifications can be made and that various modifications can be incorporated or omitted in various combinations. For example, (1) either or both of pads 82 and 116 may be incorporated or omitted; (2) either or both of back side film 112 and front side film 130 may be incorporated or omitted; (3) epoxy flux 120 may be incorporated or omitted; or (4) the like or a combination thereof. If pads 82 and/or 116 are omitted, the external electrical connectors 84 and/or 118 may be formed directly on the metallization patterns 72 and 26, respectively, in what may be referred to as a bump or ball on trace configuration.

Embodiments may achieve advantages. One or more integrated circuit dies in a first package may be communicatively coupled to one or more integrated circuit dies directly attached to the first package or one or more integrated circuit dies embedded in a second package attached to the first package. With the second package and/or integrated circuit dies attached to the front side, or "face side" of the first package, electrical connections electrically coupling the integrated circuit dies, those in the first package and exterior to the first package, may be made shorter. With shorter electrical connections, a total resistance of the connections can be decreased. With a decreased resistance, the resistance-capacitance (RC) constant of the connection is decreased, which can increase a speed of electrical signals communicated over the electrical connections. Hence, the integrated circuit dies may operate at increased speeds.

A first embodiment is a method. The method comprises forming a back side redistribution structure, and after forming the back side redistribution structure, adhering a first integrated circuit die to the back side redistribution structure. The method further comprises encapsulating the first integrated circuit die on the back side redistribution structure with an encapsulant, forming a front side redistribution structure on the encapsulant, and electrically coupling a second integrated circuit die to the first integrated circuit die. The second integrated circuit die is electrically coupled to the first integrated circuit die through first external electrical connectors mechanically attached to the front side redistribution structure.

Another embodiment is a method. The method comprises forming a first redistribution structure; adhering a back side of a first integrated circuit die to the first redistribution structure; after the adhering, encapsulating the first integrated circuit die on the first redistribution structure with an encapsulant; forming a second redistribution structure on the encapsulant, an active side of the first integrated circuit die facing the second redistribution structure; and attaching a second integrated circuit die to the second redistribution structure using first external electrical connectors mechanically attached to the second redistribution structure.

A further embodiment is a structure. The structure comprises a first package comprising a first integrated circuit die, an encapsulant laterally encapsulating the first integrated circuit die, a first redistribution structure on a first surface of the encapsulant, and a second redistribution structure on a second surface of the encapsulant. The first integrated circuit die has an active side and a back side opposite from the active side. The first surface of the encapsulant is coplanar with a surface of a die connector on an active side of the first integrated circuit die. The second surface of the encapsulant is opposite from the first surface of the encapsulant. The structure further comprises a second integrated circuit die electrically coupled to the first integrated circuit die through first external electrical connectors. The first external electrical connectors are mechanically attached to the first redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a back side redistribution structure over a carrier substrate, forming the back side redistribution structure comprising:
      forming a first insulating layer over the carrier substrate;
      forming a first metal feature over the first insulating layer;
      forming a second insulating layer over the first insulating layer and the first metal feature; and
      forming one or more additional second metal features and one or more third insulating layers, adjacent ones of the one or more additional second metal features being separated by corresponding ones of the one or more third insulating layers, the one or more additional second metal features comprising an uppermost metal feature and the one or more third insulating layers comprising an uppermost insulating layer over the uppermost metal feature;
   after forming the back side redistribution structure, adhering a first integrated circuit die to the back side redistribution structure, the adhering comprising applying an adhesive to a bottom surface of the first integrated circuit die and using a pick-and-place tool to place the first integrated circuit die on a topmost dielectric layer of the back side redistribution structure, the bottom surface of the first integrated circuit die being separated from the uppermost insulating layer of the back side redistribution structure by the adhesive;
   after forming the back side redistribution structure, forming a through via on the back side redistribution structure, the through via extending through the uppermost insulating layer to the uppermost metal feature;
   after forming the back side redistribution structure, encapsulating the first integrated circuit die on the back side redistribution structure with an encapsulant;
   after forming the back side redistribution structure, forming a front side redistribution structure on the encapsulant;
   electrically coupling a second integrated circuit die to the first integrated circuit die, the second integrated circuit die being electrically coupled to the first integrated circuit die through first external electrical connectors mechanically attached to the front side redistribution structure;
   removing the carrier substrate;

forming an opening in the first insulating layer to expose the first metal feature; and
forming a solder feature, the solder feature extending through the first insulating layer to the first metal feature.

2. The method of claim 1, wherein after the forming the front side redistribution structure, an active side of the first integrated circuit die faces the front side redistribution structure.

3. The method of claim 1, wherein forming through via comprises forming a seed layer on the back side redistribution structure, forming a photo resist on the seed layer, forming openings in the photo resist, forming a conductive material in the openings, removing the photo resist, and removing exposed portions of the seed layer, wherein after the encapsulating, the through via extend through the encapsulant.

4. The method of claim 1 further comprising forming an epoxy flux around the solder feature.

5. The method of claim 1, wherein the second integrated circuit die is in a package, the package being mechanically attached to the front side redistribution structure by the first external electrical connectors.

6. The method of claim 1, wherein the front side redistribution structure comprises an uppermost front side insulating layer, and wherein the first external electrical connectors comprises an underbump metallization extending through the uppermost front side insulating layer and a solder joint on the underbump metallization.

7. The method of claim 1, further comprising, after forming the back side redistribution structure and prior to forming the front side redistribution structure, adhering a third integrated circuit die to the back side redistribution structure, wherein the second integrated circuit die laterally overlaps the first integrated circuit die and the third integrated circuit die.

8. A method comprising:
forming a first redistribution structure over a carrier substrate, forming the first redistribution structure comprising:
forming a first insulating layer over the carrier substrate; and
forming metallization layers over the first insulating layer, each of the metallization layers being covered by one or more insulating layers;
after forming the first redistribution structure, forming through vias on the first redistribution structure, the forming the through vias comprising plating a conductive material on portions of the first redistribution structure;
after forming the first redistribution structure, adhering a back side of a first integrated circuit die to the first redistribution structure, a front side of the first integrated circuit die comprising a first pad and a first die connector electrically connected to the first pad, a top surface of the through vias being higher than a top surface of the first die connector;
after forming the first redistribution structure, adhering a back side of a second integrated circuit die to the first redistribution structure, a front side of the second integrated circuit die comprising a second pad and a second die connector electrically connected to the second pad, a top surface of the through vias being higher than a top surface of the second die connector;
after the adhering the back side of the first integrated circuit die and the adhering the back side of the second integrated circuit die, encapsulating the through vias, the first pad, the first die connector, and the first integrated circuit die on the first redistribution structure with an encapsulant;
grinding the encapsulant and the through vias, wherein after the grinding the top surface of the through vias, a top surface of the encapsulant, and the top surface of the first die connector are co-planar;
forming a second redistribution structure on the encapsulant, an active side of the first integrated circuit die facing the second redistribution structure, an active side of the second integrated circuit die facing the second redistribution structure;
attaching a packaged integrated circuit die to the second redistribution structure using first external electrical connectors mechanically attached to the second redistribution structure, an active side of the packaged integrated circuit die facing away from the second redistribution structure, wherein the packaged integrated circuit die extends completely over the first integrated circuit die and the second integrated circuit die; and
after attaching the packaged integrated circuit die, removing the carrier substrate.

9. The method of claim 8 further comprising forming second external electrical connectors on the first redistribution structure.

10. The method of claim 9, wherein the forming the second external electrical connectors is performed after the attaching the packaged integrated circuit die to the second redistribution structure.

11. The method of claim 9 further comprising, after forming the second external electrical connectors, forming an epoxy flux around the second external electrical connectors.

12. The method of claim 11, further comprising:
forming an underbump metallizations extending through a dielectric layer of the second redistribution structure, wherein the first external electrical connectors comprise solder on the underbump metallizations.

13. The method of claim 12, further comprising, after removing the carrier substrate:
forming a backside film on the first insulating layer;
forming an opening extending through the backside film and the first insulating layer to a metal feature of the metallization layers; and
forming a solder joint in the opening, the solder joint extending through the backside film and the first insulating layer to the metal feature.

14. A method comprising:
forming a first redistribution structure, over a carrier substrate, forming the first redistribution structure comprising:
forming a first insulating layer over the carrier substrate; and
forming a first metallization layer over the first insulating layer;
after forming the first redistribution structure, forming a through via on a first side of the first redistribution structure;
after forming the first redistribution structure, adhering a first integrated circuit die to the first side of the first redistribution structure;
forming a die connector on a top surface of the first integrated circuit die;
encapsulating the first integrated circuit die with an encapsulant;

forming a second redistribution structure on the encapsulant, an active side of the first integrated circuit die facing the second redistribution structure;

attaching a second integrated circuit die to the second redistribution structure using first external electrical connectors attached to the second redistribution structure, an active side of the second integrated circuit die facing away from the second redistribution structure;

after attaching the second integrated circuit die, detaching the carrier substrate;

after detaching the carrier substrate, forming a backside film on first insulating layer, the first insulating layer being interposed between the first metallization layer and the backside film;

forming a first opening in the backside film and the first insulating layer, the first opening exposing a metal feature of the first metallization layer; and forming a second external electrical connector, the second external electrical connector extending through the first opening to the metal feature.

15. The method of claim 14 further comprising, before forming the second redistribution structure on the encapsulant, grinding the encapsulant to expose a top surface of the plurality of through vias and a top surface of the die connector, wherein after grinding the top surface of the encapsulant, the top surface of the plurality of through vias, and the top surface of the die connector are all substantially co-planar.

16. The method of claim 14, wherein forming the die connector on the top surface of the first integrated circuit die comprises:
   forming a pad on the top surface of the first integrated circuit die;
   forming a passivation layer on the pad and the top surface of the first integrated circuit die;
   forming a second opening in the passivation layer to expose a portion of the pad;
   forming the die connector in the second opening in the passivation layer; and
   forming a dielectric layer over the passivation layer and laterally encapsulating the die connector, the dielectric layer being laterally co-terminus with the first integrated circuit die, wherein encapsulating the first integrated circuit die with the encapsulant comprises forming the encapsulant on sidewalls of the dielectric layer.

17. The method of claim 14, wherein the second external electrical connector comprise solder, and wherein the first redistribution structure comprises a topmost metallization pattern.

18. The method of claim 14 further comprising applying an epoxy flux around the second external electrical connector.

19. The method of claim 14, further comprising, prior to forming the second external electrical connector:
   placing the second redistribution structure on a tape.

* * * * *